(12) United States Patent
Brown et al.

(10) Patent No.: US 6,642,868 B1
(45) Date of Patent: Nov. 4, 2003

(54) APPARATUS AND METHOD FOR THE CORRECTION OF DC OFFSET IN DATA BUS STRUCTURES AT THE RECEIVER

(75) Inventors: Russell W. Brown, Nepean (CA); Kristopher Kshonze, Ottawa (CA); Ivan Chan, Kanata (CA); Mehran Aliahmad, Ottawa (CA)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 10/051,137

(22) Filed: Jan. 22, 2002

Related U.S. Application Data

(63) Continuation of application No. 09/568,504, filed on May 11, 2000, now Pat. No. 6,356,218.

(51) Int. Cl.[7] ............................................... H03M 1/10
(52) U.S. Cl. ...................................... 341/120; 341/144
(58) Field of Search ................................. 341/120, 144, 341/118, 155; 327/307

(56) References Cited

U.S. PATENT DOCUMENTS

| | | | |
|---|---|---|---|
| 4,143,361 A | 3/1979 | Tammes et al. ...... 340/347 CC |
| 4,542,354 A | 9/1985 | Robinton et al. .......... 332/11 D |
| 4,965,867 A | * 10/1990 | Tsuchida et al. ............. 341/118 |
| 5,877,645 A | 3/1999 | Comino et al. ............. 327/350 |
| 5,898,395 A | 4/1999 | Werrbach et al. ........... 341/118 |
| 6,356,218 B1 | * 3/2002 | Brown et al. ................ 341/120 |

* cited by examiner

Primary Examiner—Peguy JeanPierre
(74) Attorney, Agent, or Firm—Anthony L. Miele; Palmer & Dodge, LLP (57) ABSTRACT

DC offset introduced into a differential signal is compensated for by DC offset correction circuitry. The DC offset correction circuitry receives a known training pattern of alternating logic high and logic low levels (i.e., 10101010 etc.). In one embodiment, the received signal is integrated and the result compared to a predetermined reference level. The result of the comparison is used to adjust a DC offset correction value that is added to the received signal. This process is iteratively performed until successive results of the comparison indicate that the DC offset has been compensated for in another embodiment, the duty-cycle of the received signal is calculated. The result of the duty-cycle calculation is used to iteratively adjust the DC offset correction value.

13 Claims, 8 Drawing Sheets

APPARATUS AND METHOD FOR THE CORRECTION OF DC OFFSET IN DATA BUS STRUCTURES AT THE RECEIVER

This is a Continuation of U.S. application Ser. No. 09/568,504 filed May 11, 2000 now U.S. Pat. No. 6,356,218, the entirety of which is incorporated herein by reference.

BACKGROUND OF THE INVENTION

1. Field of the Invention

Aspects of the invention relate to parallel data bus structures. Other aspects of the present invention relate to the detection and correction of DC offset incorporated in a digital data signal as it is transmitted over a parallel data bus.

2. Description of Related Art

In a computer environment, a parallel data bus typically provides the main communication link between CPUs and peripheral devices such as disk drives, printers, scanners, and any other device requiring access to the bus for transmitting and receiving information. The maximum length of the bus as well as the maximum number of peripheral devices that can be connected to the bus is dictated by a protocol that corresponds to the type of bus used. In addition to these parameters, the protocol also specifies the maximum rate at which data can be transmitted across the bus.

One such parallel data bus is the Small Computer System Interface (SCSI). SCSI is a set of ever changing electronic interface standards/protocols that allow faster and more flexible parallel communication between computers and peripheral hardware over previous interfaces. For example, the Ultra-3 SCSI standard/protocol specifies a bus that can be 12 meters in length, connect up to 16 devices, and transmit data at a rate of 160 Mbytes per second (40 MHz). A list of the various adopted SCSI standards/protocols and their main attributes are summarized in TABLE 1.

TABLE 1

| SCSI Standard | Maximum Cable Length (m) | Maximum Speed (Mbytes/sec) | Maximum Number of Devices |
| --- | --- | --- | --- |
| SCSI-1 | 6 | 5 | 8 |
| SCSI-2 | 6 | 5–10 | 8 or 16 |
| Fast SCSI-2 | 3 | 10–20 | 8 |
| Wide SCSI-2 | 3 | 20 | 16 |
| Fast Wide SCSI-2 | 3 | 20 | 16 |
| Ultra SCSI-3, 8-bit | 1.5 | 20 | 8 |
| Ultra SCSI-3, 16-bit | 1.5 | 40 | 16 |
| Ultra-2 SCSI | 12 | 40 | 8 |
| Wide Ultra-2 SCSI | 12 | 80 | 16 |
| Ultra-3 (Ultra160/m) SCSI | 12 | 160 | 16 |

The SCSI standard is-subject to the same signal distortion and interference that is seen in most digital transmission devices. Examples of interference that affect communications between devices on a SCSI parallel data bus include inter-symbol interference (ISI), noise coupled to the transmission line from external sources, and DC offset, which is the phenomenon of a DC voltage being added to a transmitted signal either by the transmitter or by the signal path. This interference can result in the unreliable detection of data by a receiver.

When data transmission speeds are increased, the frequency content is also increased. When a signal with a high data rate is transmitted over a finite bandwidth medium, its amplitude is attenuated. As an example, consider a non-return to zero (NRZ) SCSI signal propagating at 80 MHz (320 Mbytes/s) over a distance of ten meters. Attenuation of this signal can reach up to twelve decibels; i.e., only ¼ of the amplitude of the original signal reaches its destination.

In a SCSI environment, the transmitted signal faces random DC offsets estimated at ±100 mV. While the amplitude of the signal is attenuated, the DC offsets are not, and they represent a significant portion of the received signal. As a consequence, erroneous bit detection may occur at the receiver. If the original amplitude of the signal in the above example is 500 mV and the transmitter introduces a 50 mV DC offset, this only results in a 10% error. However, this same signal at the receiver after traversing the SCSI data bus and experiencing a 12 decibel attenuation has an amplitude of 125 mV. Now, the 50 mV DC offset constitutes a 40% error.

Figure 1A:
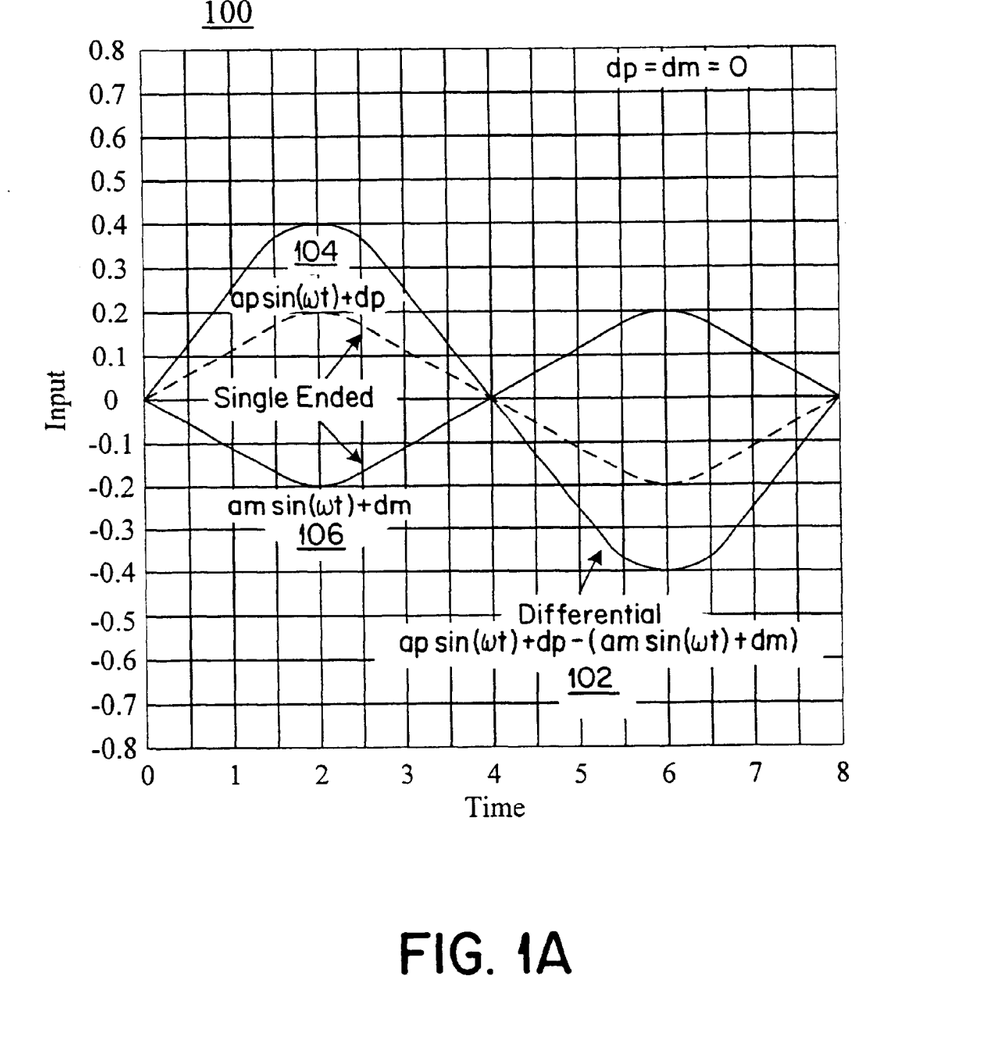
FIG. 1 illustrates the concept of DC offset in single ended signals as well as differential signals.
Figure 1B:
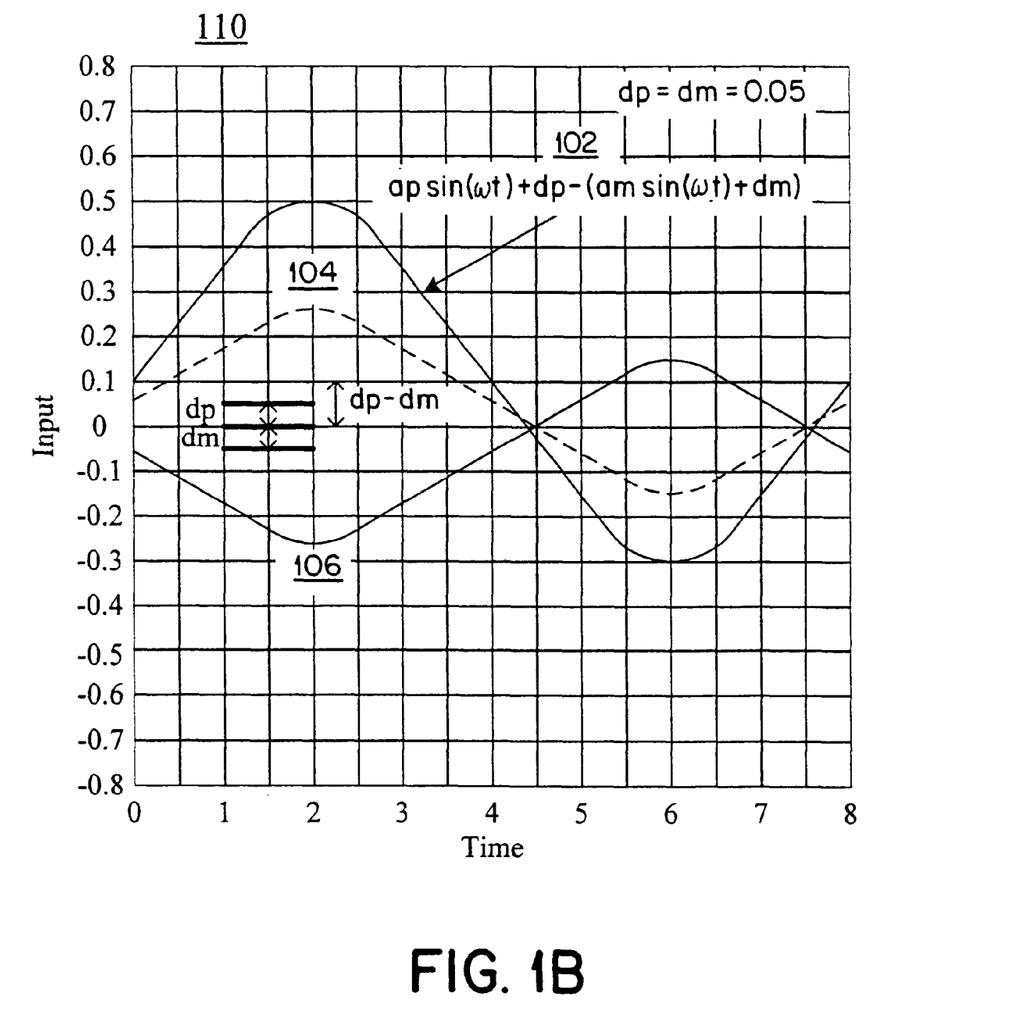

FIG. 1A and FIG. 1B illustrate the concept of DC offsets. FIG. 1A shows a graph of two signals, [ap sin($\omega$t)+dp] 104 and [am sin($\omega$t)+dm] 106, that comprise a differential signal [ap sin($\omega$t)+dp−(am sin($\omega$t)+dm)] 102, where dp and dm are the DC offsets associated with each signal. As is shown, dp=dm=0 in FIG. 1A; hence the DC offset is zero. In FIG. 1B, the signals 102, 104 and 106 are shown with a DC offset introduced. When signals 104 and 106 are combined to produce the differential signal 102, the DC offset represents 12.5% of the peak-to-peak amplitude, as is shown. If this signal suffers 12 decibels of attenuation during transmission, the DC offset will prevent the receiver comparator from switching during transitions, as there is sufficient DC offset for the single ended signals never to cross each other, i.e., the transmitted information can not be detected and is lost.

The low voltage differential (LVD) signaling scheme currently used to detect SCSI signals compensates for dc offset introduced by terminator circuits to ensure deassertion on a floating or idle bus. However, this compensation technique does not sense and correct actual signal path offset.

Therefore, a need exists for a novel/improved apparatus and method that will mitigate the DC offset that an information signal experiences as a result of its transmission across a parallel data bus (e.g., a SCSI parallel data bus) between devices.

BRIEF DESCRIPTION OF THE DRAWINGS

The above and other objects, features, and advantages of the present invention are further described in the detailed description which follows, with reference to the drawings by way of non-limiting exemplary embodiments of the present invention, wherein.

DETAILED DESCRIPTION

A commonly assigned application entitled "Sampled Analog DC Offset Correction For Data Bus Structures" filed concurrently herewith in the names of Mehran Aliahmad, Kristopher Kshonze, and Russell W. Brown is hereby expressly incorporated by reference herein in its entirety. That application discloses an alternate embodiment for correcting DC offset in parallel data bus structures.

The embodiments as described below may be implemented with one or a combination of software, firmware, and hardware. Hence, the operation and behaviour of the embodiments will be described without specific reference to, e.g., software code or specialized hardware components.

Figure 2:
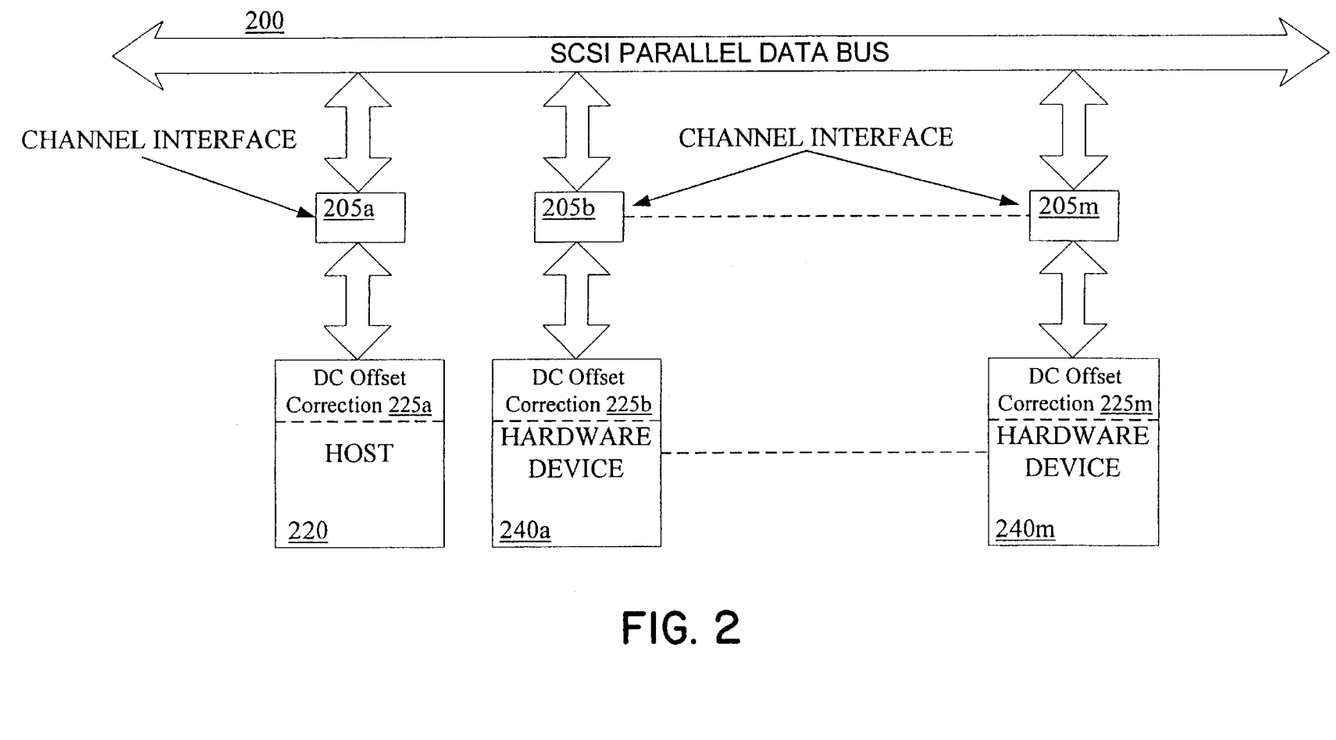
FIG. 2 is a high-level functional block diagram of a host coupled to various hardware devices via a SCSI parallel data bus with DC offset correction apparatuses placed at the receivers of these devices.

FIG. 2 is a block diagram illustrating devices connected to a SCSI parallel data bus. A host 220 and various hardware devices 240a ... 240m are coupled to SCSI parallel data bus 200 via channel interface units 205a ... 205m. Hardware devices 240a ... 240m may include CD ROM record/playback devices, scanners, disk drives, printers, or any other peripheral device designed for communication via parallel bus 200. Channel interface units 205a ... 205m facilitate the connection of the individual devices, e.g., host 220 and hardware devices 240a ... 240m, to the respective lines of SCSI parallel data bus 200 from where information, e.g. digital data in the form of an oscillating differential signal, is received.

The receivers of host 220 and hardware devices 240a ... 240m contain DC offset correction circuitry 225a ... 225m (described in more detail below) that nullifies DC offsets introduced into the SCSI signals. These offsets are inherently introduced into signals on bus 200. DC offset is a function of the signal path and not of the data signal itself.

A fixed training pattern is used to train DC offset correction circuitry 225a ... 225m. More particularly, one of host 220 or hardware devices 240 transmit a fixed binary training pattern to the offset correction circuit 225 being initialized. The correction circuit 225 uses the fixed training pattern to measure the DC offset introduced from the transmitting device, and henceforth compensates transmissions from that device by subtracting out the measured DC offset.

Initialization of the DC offset correction can be conducted at any of a variety of times. For example, the training patterns may be programmed to be transmitted in scheduled intervals of, for example, 10 minutes, 1 hour, or 2 hours, or they can be transmitted on power up with subsequent small-scale corrections during transmission to accommodate DC drift.

Figure 3:
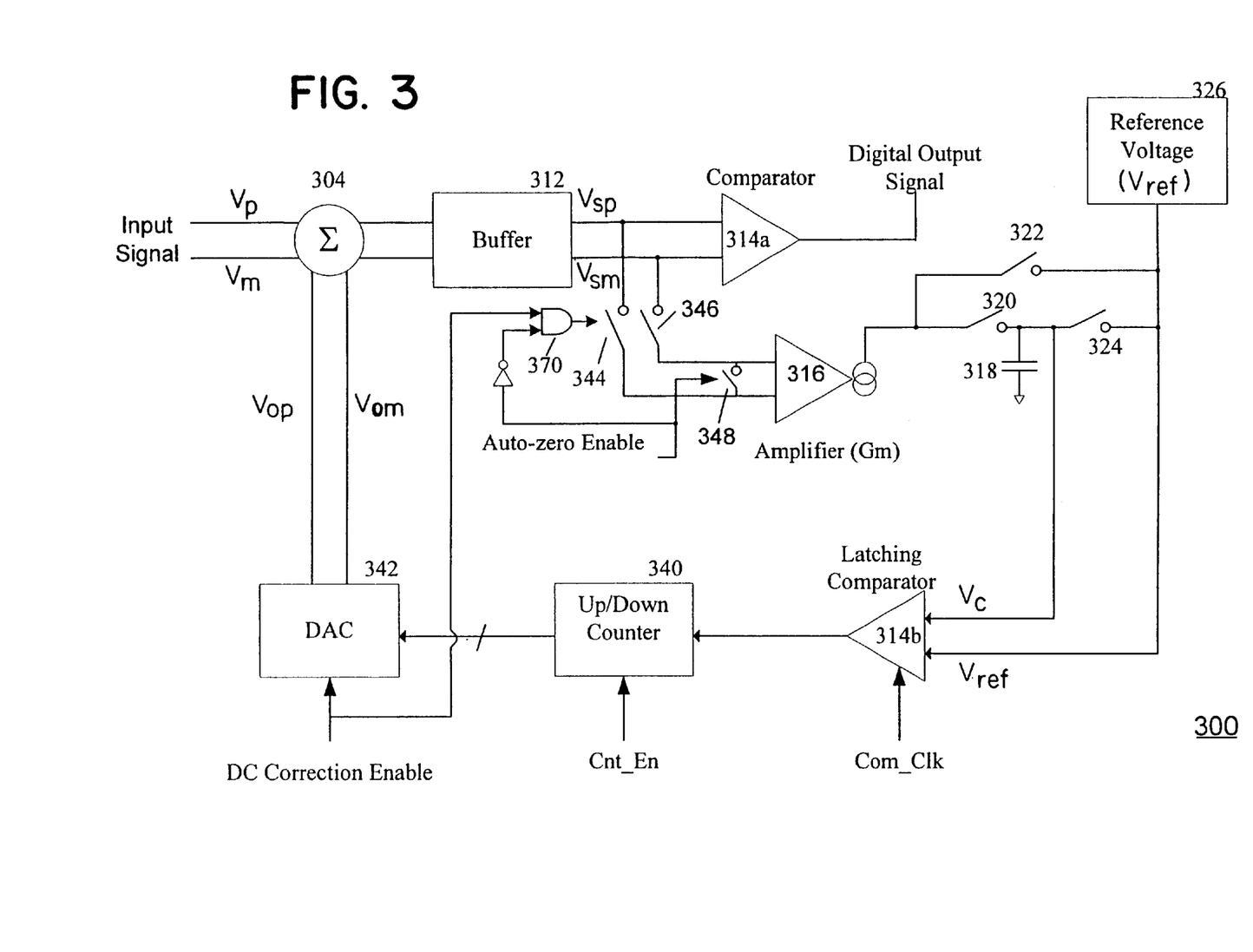
FIG. 3 is a high-level functional block diagram depicting a detailed embodiment of the DC offset correction apparatus.

FIG. 3 is a high-level block diagram illustrating a first embodiment of DC offset correction circuitry 225a ... 225m as circuit 300. Circuit 300 includes analog summation circuit 304; buffer 312; transconductance amplifier 316; switches 320, 322, 324, 344, 346, and 348; capacitor 318; comparator 314b; up/down counter 340; digital-to-analog (DAC) converter 342, and reference voltage ($V_{ref}$) source 326. Switches 320, 322, 324, 344, 346, and 348 may be, for example, conventional MOSFET switches. Summation circuits, buffers, transconductance amplifiers, counters, digital-to-analog converters, and reference voltage sources are individually well known in the art. Accordingly, further details of the implementation will not be described further herein.

In general, circuit 300 acts to integrate incoming test signals. Incoming signals with no DC offset should have a total integration value of zero over any complete period of the periodic training pattern. If the integration result is not zero, the circuit adds or subtracts DC offset to the test signal until the integration value is zero (or near zero). At this point, the DC offset has been compensated for. Regular data transmission can thus begin using the appropriate DC offset compensation values.

Figure 4:
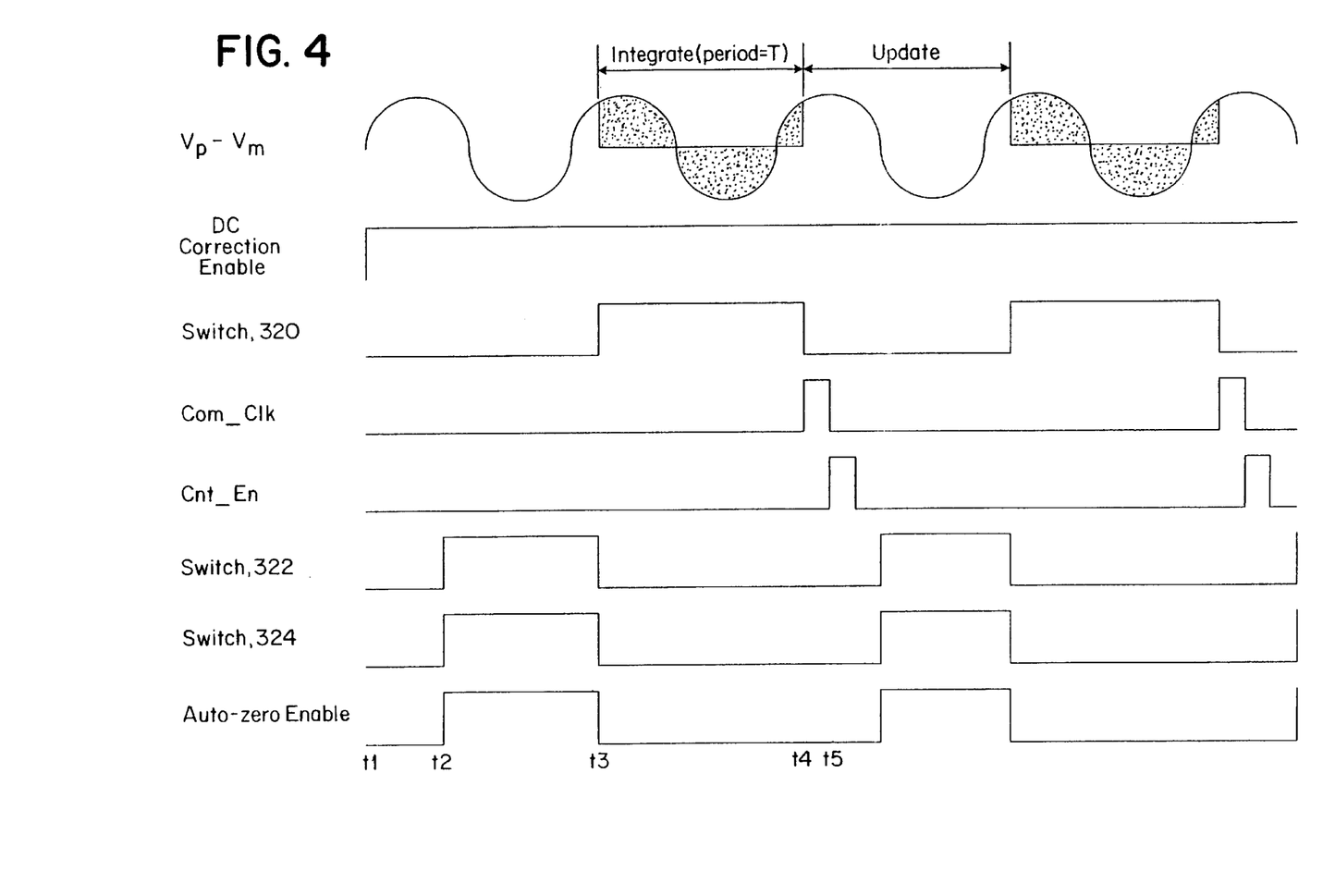
FIG. 4 is a timing diagram of the control signals used in the embodiment of FIG. 3.

FIG. 4 is a timing diagram illustrating states of signals in FIG. 3 during DC offset compensation. DC offset compensation begins when the control signal DC Correction Enable is asserted by host 220 or hardware device 240 (time t1). Switches 322 and 324 are then closed, (time t2), thereby placing reference voltage ($V_{ref}$) 326 onto the output of transconductance amplifier 316 and capacitor 318. Reference voltage 326 ensures that a smooth signal transition will occur when switch 320 is closed and is used as a reference to comparator 314b.

Along with closing switches 322 and 324, the signal Auto-zero Enable is also asserted (time t2). Asserting Auto-zero Enable closes switch 348 (thus shorting the input of amplifier 316) and opens switches 344 and 346. Transconductance amplifier 316 may itself introduce DC offset into signals it is amplifying. Shorting the inputs to the transconductance amplifier 316 allows amplifier 316 to self-compensate for any internal DC offset. Transconductance amplifier auto-zero compensation is known in the art. The required circuitry is assumed internal to amplifier block 316 and will not be described further herein.

As shown in FIG. 4, the differential training pattern ($V_p - V_m$) which when processed by comparator 314a comprises a series of alternating logic levels (i.e., 10101010), is input to circuit 300 from data bus 200 during DC offset training. An initial offset correction voltage, ($V_{op} - V_{om}$), is added to the input signal by summation circuit 304. This initial offset correction voltage is provided by DAC 342, which outputs an analog signal corresponding to a digital input value from up/down counter 340. DAC 342 begins by initially outputting a predetermined voltage level.

At time t3, the Auto-zero Enable signal is deasserted, switches 322, 324, and 348 are opened, and switch 320 is closed. The deassertion of the Auto-zero Enable signal also serves to control AND gate 370 to close switches 344 and 346. Closing switches 344 and 346 inputs the differential signals $V_{sp}$ and $V_{sm}$ to transconductance amplifier 316, which amplifies the difference of the signals and converts the difference to an output current signal. The output current signal flows through closed switch 320 and charges capacitor 318. Capacitor 318 in conjunction with transconductance amplifier 316 forms an integrator circuit. Simultaneously, by opening switches 322 and 324, reference voltage 326 is removed from the capacitor 318.

As shown in FIG. 4, integration by capacitor 318 is accomplished over one cycle of the input signal, $V_p - V_m$, where the start and finish of the integration cycle do not need to be synchronous with the signal. However, the integration interval, i.e., the assertion period of switch 320, must be an exact integer multiple of the period T of the training signal $V_p - V_m$. In the example shown, the offset correction cycle has a period of 2T, and consists of an integration cycle of duration T followed by an update cycle of duration T. The duration of the offset correction cycle can be increased if desired to allow more time for the integration or update cycles.

At the beginning of each integration cycle, the voltage on capacitor 318 is reset to the reference voltage $V_{ref}$ by switch 324. With zero offset in training signal $V_{sp} - V_{sm}$, the voltage, $V_C$, on capacitor 318 will return to the value $V_{ref}$ at the end of each integration cycle. When an offset component is present in $V_{sp}-V_{sm}$, the voltage $V_C$ on capacitor 318 at the end of each integration cycle will differ from $V_{ref}$ by an amount:

$$V_{ref} - V_C = \frac{K}{C}[(dp - dm) \times T]$$

where T is the integration period, $V_C$ is the voltage on capacitor 318, K is a constant which depends on circuit implementation, C is the capacitance, and the differential offset is dp-dm. Nominal values for K and C are $333 \times 10^{-6}$ and 0.5 pF, respectively.

The integration cycle completes, and the update cycle begins, at time t4. Switch 320 is opened and the Com_Clk signal is asserted, latching the result of the comparison between $V_{ref}$ and $V_C$ into the output stage of comparator 314b. This value is input to up/down counter 340 and controls the direction of up/down counter 340. The signal Cnt_En 330 is pulsed, (time t5), which increments or decrements counter 340 depending on the output of comparator 314b, and the resultant digital value on up/down counter 340 is passed to DAC 342. DAC 342 converts the digital signal received into its analog counterpart, which either incrementally increases or decreases the voltage that is added to the input differential test signal $V_p-V_m$.

This process of iteratively integrating and updating continues until such time that the DC offset present in the input signal is corrected. The point can be determined from the output of comparator 314b. When the comparator output oscillates back and forth from logic high to logic low during successive integration cycles (i.e., the comparator output is 10101010), the DC offset has been corrected to the resolution of counter 340 and DAC 342. At this time, the DC Correction Enable signal 310 is deasserted, which removes transconductance amplifier 316 and the rest of the associated test circuitry from the input signal path. Because the output of DAC 342 is frozen at the last DC offset correction value, valid data subsequently input to circuit 300 is compensated for its DC offset by summer 304.

Figure 5A:
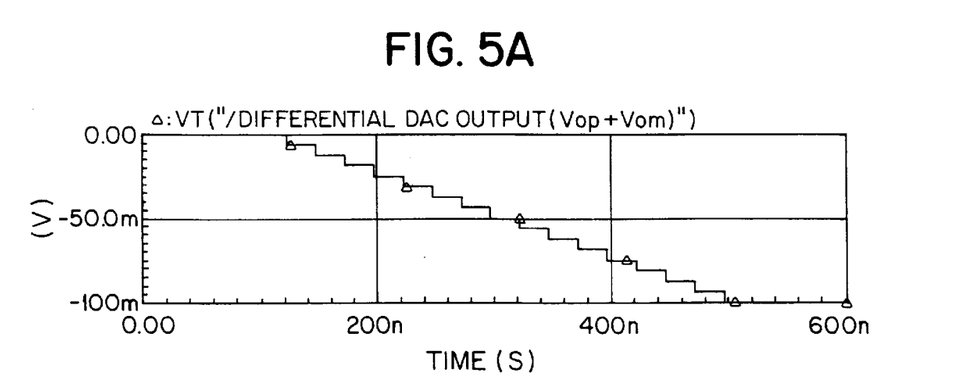
FIG. 5 illustrates the results of a simulation performed with the DC offset correction apparatus of FIG. 3.
Figure 5B:
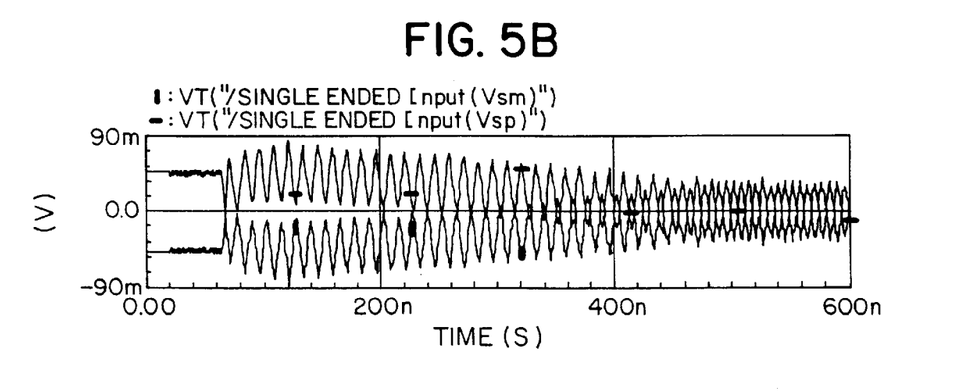
Figure 5C:
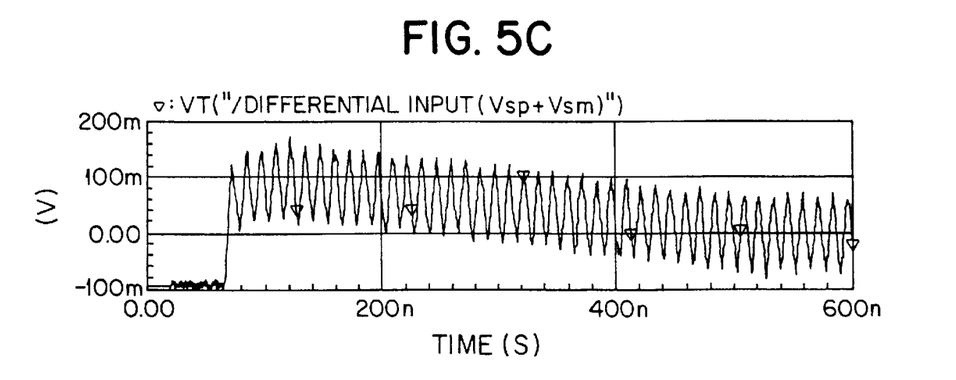

Simulation results of DC offset correction circuitry 300 are shown in FIG. 5. A differential signal with an initial DC offset of 100 mV is input. The individual single ended signals, $V_p$ and $V_m$, are shown in the middle graph of the figure. The differential signal, $V_p-V_m$, is shown in the bottom graph. In the top graph, the differential output of DAC 342 is shown as the DC offset correction process proceeds. DAC 342 is programmed to increase or decrease the correction voltage by 6.25 mV on each successive iteration of the integrate and update procedure. In this simulation, the correction voltage is continually decreased, as can be seen in the top graph of the figure. The update cycle occurs every 25 ns, thus giving a full-scale offset correction in 400 ns, as shown in the middle and bottom graphs.

Figure 6:
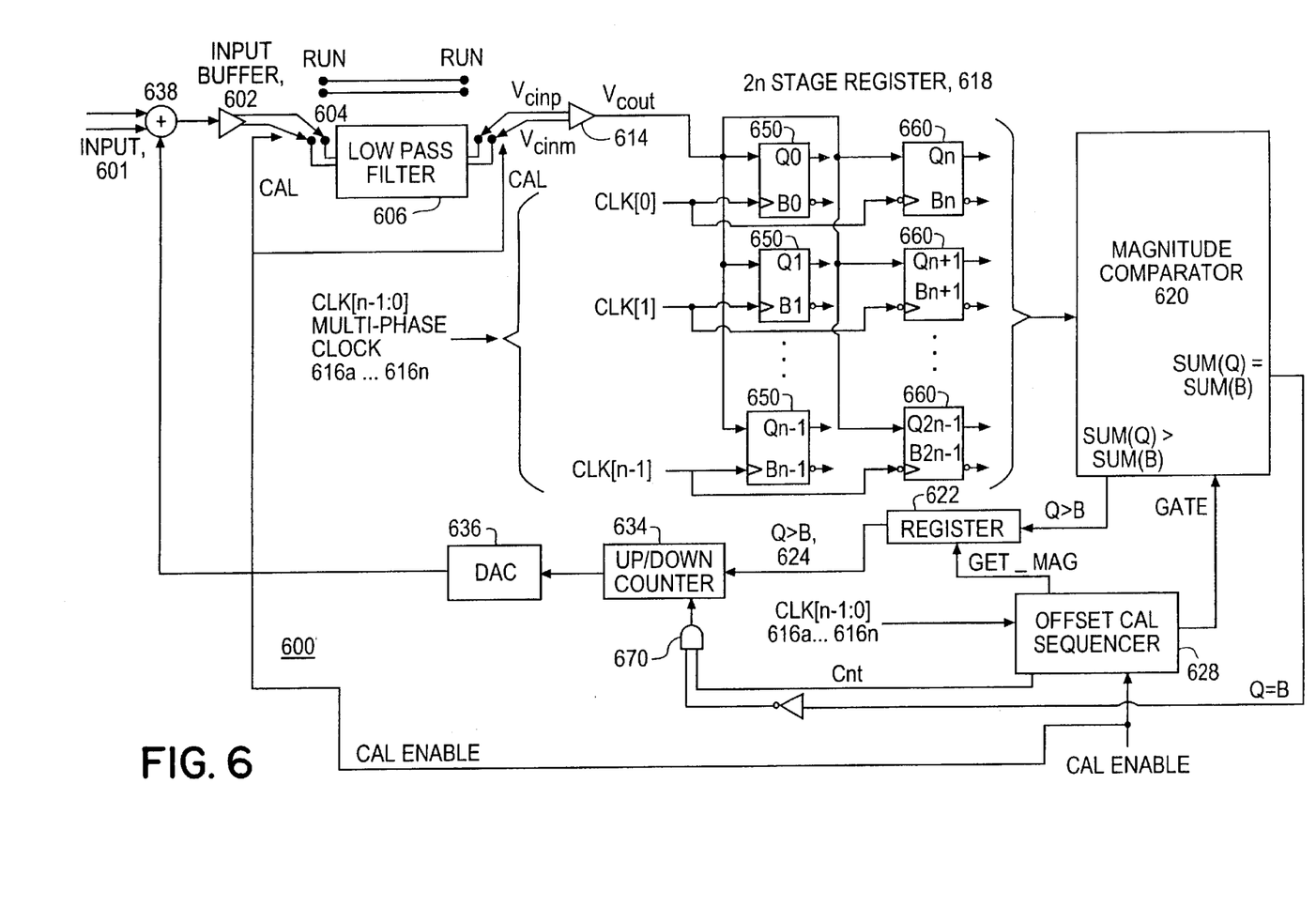
FIG. 6 is a high-level functional block diagram depicting a second detailed embodiment of the DC offset correction apparatus.

A second embodiment of DC offset correction circuitry 225a . . . 225m is shown in FIG. 6 as circuit 600. In this embodiment, DC offset correction is accomplished by determining the output duty cycle of comparator 614. A typical receiver in a digital transmission system contains a comparator, 614 in FIG. 6, to convert the attenuated received signal into a full-swing logic levels. For a symmetrical training signal pattern, e.g., a 101010 . . . 101010 data pattern, the duty cycle at the output of this comparator gives a measure of the total signal path offset at the comparator input, including the offset of the receiver comparator input stages.

This embodiment uses the receiver comparator output duty cycle as the offset nulling loop. Accordingly, a DC correction signal is added to the input signal in summer 638, and this correction signal is recursively adjusted such that a 50:50 duty cycle is obtained at the comparator 614 output, thus correcting the DC offset introduced by the transmission path.

Circuit 600 includes summation circuit 638, input buffer 602, low pass filter 606, switch 604, comparator 614, 2n stage register 618, digital summer/comparator 620, up/down counter 634, digital-to-analog converter (DAC) 636, register 622, and offset CAL sequencer 628. Control signals CAL Enable, Get_Mag, Gate, and Cnt are used in conjunction with a multiphase clock 616a . . . 616n and the components listed to produce a correction signal that nullifies DC offset in the differential input signal 601 ($V_p-V_m$).

The multi-phase clock 616a . . . 616n, with N phases equally space over the bit-cell interval, T, is used as a time base for duty-cycle determination. The clock phases that align with the rising and falling edges of the comparator output waveform during a symmetrical (e.g., 1010 . . . 1010) training pattern are determined, and the comparator output duty cycle is then calculated from this result. The relation between comparator output duty cycle and input offset is given by the signal slew rate at the comparator 614 input. For example, for N=16 phases in a 6.25 ns bit-cell, the clock phase time resolution is 0.39 ns. To obtain a 10 mV offset resolution, the slew rate at the comparator input must be limited to 10 mV/0.39 ns=25 mV/ns. This can be achieved by reducing the receive signal bandwidth during offset correction. The block diagram shows a low-pass filter 606 switched into the signal path to represent this bandwidth reduction during offset calibration. In practice, this bandwidth reduction can be accomplished by reducing the bandwidth of the receiver input buffer 602.

Figure 7:
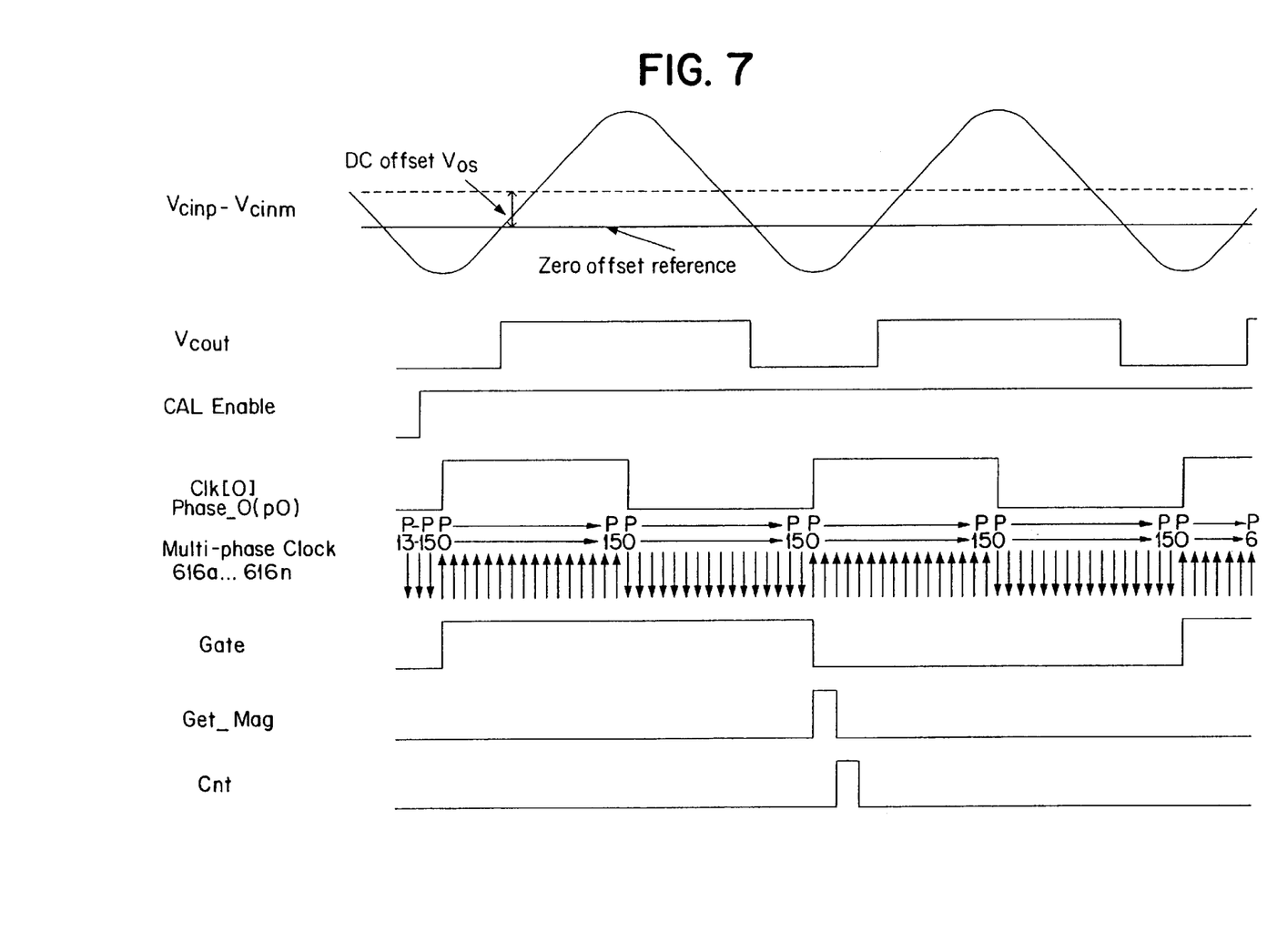
FIG. 7 is a timing diagram of the control signals used in the embodiment of FIG. 6.

FIG. 7 is a timing diagram illustrating the relationship of the above control signals, voltage $V_{cin}$, and voltage $V_{cout}$. The assertion of the CAL Enable signal begins operation of the offset correction circuit by controlling switch 604 to place the low pass filter circuit 606 into the path of input signal 601. A training pattern comprising alternating assertion and deassertion logic states (i.e., 101010) is received on input signal 601. Summation circuit 638 adds an initial DC correction voltage from DAC 636 and the signal is passed to input $V_{cin}$ of comparator 614 via input buffer 602 and low pass filter 606.

As is shown in FIG. 7, $V_{cout}$ is a digitized version of signal $V_{cin}$ that changes state whenever $V_{cin}$ crosses $V_{ref}$ plus the DC offset (illustrated as $V_{os}$). The DC offset present on $V_{cin}$ thus effects the duty cycle of the digital waveform $V_{cout}$.

The 2n stage bit register 618 includes multiple delay type flip-flops. Each of the flip-flops in 2n bit register 618 is activated by a different one of the clock pulses in the multi-phase clock signal 616a . . . 616n. Flip-flops 650 sample $V_{cout}$ on the rising edge of their respective input clock pulses from the multi-phase clock, while flip-flops 660 sample $V_{cout}$ on the falling edge of their respective clock pulses. The sampled values are output by the flip-flops at their "Q" terminals and inverted versions of the sampled values are output at their "B" terminals. In this manner, for each complete period of multi-phase clock 616a . . . 616n, $V_{cout}$ is sampled once by each of flip-flops 650 and 660, for a total of 2n samples, where n is the number of multi-phase clock input lines (see FIG. 7 for an illustration of the rising and falling edges in multi-phase clock 616a . . . 616n, in which n=16).

Offset CAL sequencer 628 also receives multi-phase clock signal 616a . . . 616n. After each complete sampling period of the multi-phase clock signal, such as the period shown by Clk[0] in FIG. 7, sequencer 628 activates the two output lines of digital slummer/comparator 620 using the "Gate" signal. The signal "Q>B" is input to register 622, where it is then forwarded to up/down counter 634.

The summer/comparator 620 sums the number of logic high ("1's") that are input on the "Q" lines from flip-flops 650 and 660, and sums the number of logic high ("1's") that are input on the "B" lines from flip-flops 650 and 660. The summer/comparator 620 then compares the two sums, and asserts the Q>B line if the sum of the Q's is greater than the sum of the B's. It asserts the Q=B line if the two sums are equal. If the sum of the Q's is greater than the sum of the B's, $V_{cout}$ has a duty cycle greater than 50%, which indicates that $V_{cin}$ has a positive DC bias. If the sum of the B's is greater than the sum of the Q's, $V_{cin}$ has negative DC bias.

The output of register 622 controls the counting direction of up/down counter 634. Offset CAL sequencer 628 enables up/down counter 634 by asserting the "Cnt" signal. If the magnitude comparator 620 asserts the "Q=B" signal, this signal, after inversion and passing through AND gate 670, disables the up/down counter even if the Cnt signal is asserted.

The resulting count value from up/down counter 634 is passed to DAC 636, which converts the digital signal received to its analog counterpart, either increasing or decreasing the voltage that is added to input signal 601. This process of measuring the duty cycle of $V_{cout}$ continues until the "Q=B" signal is asserted (i.e., until $V_{cout}$ has approximately a 50% duty cycle), which freezes the output of the counter 634. With the output of counter 634 frozen, the DC offset correction voltage input to summer 638 remains constant. The CAL Enable signal may then be deasserted, removing the band limiting filter 606 from the signal path.

It is important to note that-the foregoing description of embodiments of the present invention provides illustration and description, but is not intended to be exhaustive or to limit the invention to the precise form disclosed. Modifications and variations are possible consistent with the above teachings or may be acquired from practice of the invention. The claims and their equivalents define the scope of the invention.

It is to be noted that although the present embodiment is implemented to eliminate DC offset caused by a SCSI parallel data bus, this does not limit the scope of the invention. The invention disclosed herein could conceivably be used with any data transmission line susceptible to DC offset.

What is claimed:

1. A direct current (DC) offset compensation circuit for mitigating DC offset within a plural level received signal transmitted over a pair of differential lines of a parallel interface, the compensation circuit comprising:

a summer to subtract, from a received signal carried on the pair of differential signal lines, a DC compensation signal;

integration circuitry to receive and to integrate a compensated training signal and produce an integration value;

a received signal comparator for signalling when the received signal makes a transition;

a signal transition smoothing circuit to smooth an output of the integration circuitry;

an integration value comparator to signal when an integration value provided by the integration circuitry changes in relation to a reference voltage;

a DC compensation signal adjustment device to output a DC compensation signal and to increase and decrease the DC compensation signal in accordance with when the integration value produced by the integration circuitry is above or below the reference voltage.

2. The circuit according to claim 1, wherein the integration circuitry comprises a switching mechanism to selectively couple the integration circuitry to the summer.

3. The circuit according to claim 1, wherein the integration circuitry comprises an amplifier with inputs coupled to respective differential signal lines output by the summer.

4. The circuit according to claim 3, wherein said amplifier comprises a transconductance amplifier.

5. The circuit according to claim 4, further comprising a capacitor selectively connected between an output of the transconductance amplifier and ground.

6. The circuit according to claim 1, wherein said received signal comparator signals when a received signal makes a transition through a reference level.

7. The circuit according to claim 6, wherein said received signal comparator signals when a received signal makes a transition through zero.

8. The circuit according to claim 1, wherein said signal transition smoothing circuit comprises a reference voltage selectively connected to an output of the integration circuitry.

9. The circuit according to claim 1, wherein said signal transition smoothing circuit comprises a reference voltage connected to an output of the integration circuitry via a switch.

10. The circuit according to claim 1, wherein the integration value comparator comprises a latching comparator.

11. The circuit according to claim 1, wherein a buffer is connected between the summer and the integration circuitry.

12. The circuit according to claim 1, wherein an up/down counter gets the output of the comparator as its input.

13. The circuit according to claim 1, wherein a digital-to-analog converter converts the digital value from the up/down counter to an analog signal.

* * * * *